United States Patent
Lee et al.

(10) Patent No.: US 8,473,694 B2
(45) Date of Patent: Jun. 25, 2013

(54) MEMORY DEVICE AND MEMORY SYSTEM COMPRISING SAME

(75) Inventors: Dong-Hyuk Lee, Seoul (KR); Jung-Bae Lee, Yongin-si (KR); Ki-Won Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 331 days.

(21) Appl. No.: 12/885,728

(22) Filed: Sep. 20, 2010

(65) Prior Publication Data
US 2011/0072205 A1 Mar. 24, 2011

(30) Foreign Application Priority Data
Sep. 21, 2009 (KR) .......................... 10-2009-0088817

(51) Int. Cl.
*G06F 12/00* (2006.01)
(52) U.S. Cl.
USPC ........................................................ 711/154
(58) Field of Classification Search
None
See application file for complete search history.

(56) References Cited

U.S. PATENT DOCUMENTS

| | | | |
|---|---|---|---|
| 6,456,098 B1 * | 9/2002 | Pochmuller | 324/719 |
| 6,721,215 B2 * | 4/2004 | Le et al. | 365/200 |
| 7,515,470 B2 * | 4/2009 | Tokiwa | 365/185.09 |
| 2010/0153793 A1 * | 6/2010 | Murray | 714/718 |

FOREIGN PATENT DOCUMENTS

| | | |
|---|---|---|
| JP | 05109268 A | 4/1993 |
| JP | 2002063787 A | 2/2002 |
| KR | 1020050010655 A | 1/2005 |

* cited by examiner

*Primary Examiner* — Hiep Nguyen
(74) *Attorney, Agent, or Firm* — Volentine & Whitt, PLLC

(57) ABSTRACT

A memory device comprises a memory cell array comprising a plurality of memory blocks each comprising a plurality of memory cells and a control setting circuit. The control setting circuit divides the memory blocks into at least first and second groups based on whether each of the memory blocks comprises at least one substandard memory cell, and sets individually control parameters of the first and second groups. The substandard memory cells are identified based on test results of the memory cells with respect to at least one of the control parameters. Each memory block in the first group comprises at least one substandard memory cell, and each memory block in the second group comprises no substandard memory cell.

20 Claims, 13 Drawing Sheets

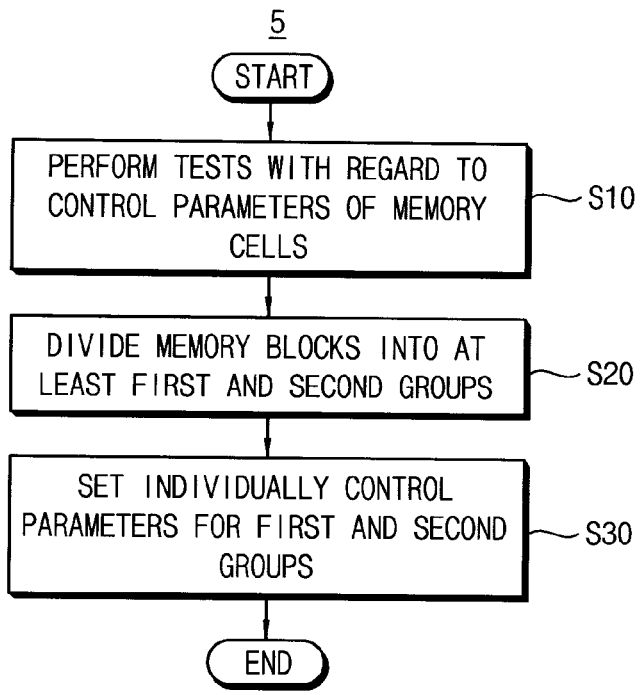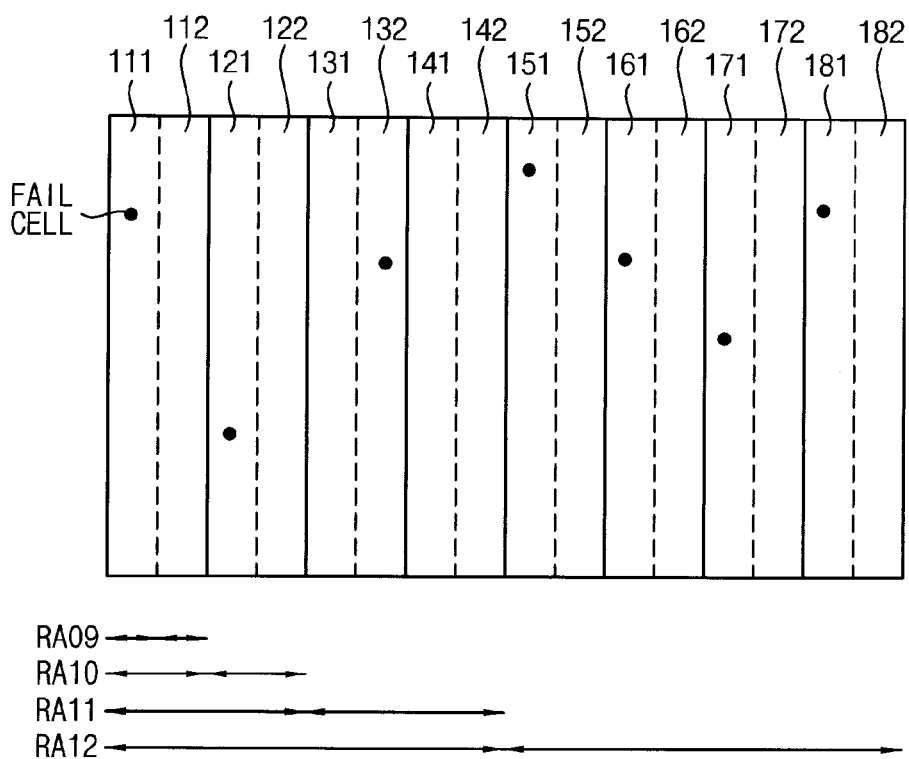

| RA12 | RA11 | RA10 | RA9 | RA8~RA0 |
|------|------|------|-----|---------|
| 0 | 0 | 0 | 0 | |
| 0 | 0 | 0 | 1 | |
| 0 | 0 | 1 | 0 | |
| 0 | 0 | 1 | 1 | |
| 0 | 1 | 0 | 0 | |
| 0 | 1 | 0 | 1 | |
| 0 | 1 | 1 | 0 | |
| 0 | 1 | 1 | 1 | |
| 1 | 0 | 0 | 0 | |
| 1 | 0 | 0 | 1 | |
| 1 | 0 | 1 | 0 | |
| 1 | 0 | 1 | 1 | |
| 1 | 1 | 0 | 0 | |
| 1 | 1 | 0 | 1 | |
| 1 | 1 | 1 | 0 | |
| 1 | 1 | 1 | 1 | |

| RA0_DIS | RA1_DIS | RA2_DIS | RA3_DIS | ADDL | ADDP |
|---|---|---|---|---|---|
| 1 | 0 | 0 | 0 | VDD | RA0P |
| | | | | RA0 | RA1P |
| | | | | RA1 | RA2P |
| | | | | RA2 | RA3P |
| 0 | 1 | 0 | 0 | RA0 | RA0P |
| | | | | VDD | RA1P |
| | | | | RA1 | RA2P |
| | | | | RA2 | RA3P |
| 0 | 0 | 1 | 0 | RA0 | RA0P |
| | | | | RA1 | RA1P |
| | | | | VDD | RA2P |
| | | | | RA2 | RA3P |
| 0 | 0 | 0 | 1 | RA0 | RA0P |
| | | | | RA1 | RA1P |
| | | | | RA2 | RA2P |
| | | | | VDD | RA3P |

| RA0_IN | ADDL | ADDP |
|--------|------|------|
| 0 | RA0B | RA0P |
| 1 | RA0 | RA0P |

| RA0_IN | ADDL | ADDP |
|--------|------|------|
| 0 | 1 | RA0P |
| 1 | 0 | RA0P |

MEMORY DEVICE AND MEMORY SYSTEM COMPRISING SAME

CROSS-REFERENCE TO RELATED APPLICATIONS

This application claims priority under 35 USC §119 to Korean Patent Application No. 10-2009-0088817 filed on Sep. 21, 2009, the disclosure of which is hereby incorporated by reference in its entirety.

BACKGROUND

Embodiments of the inventive concept relate generally to semiconductor technology. More particularly, embodiments of the inventive concept relate to semiconductor memory devices and memory systems incorporating the semiconductor memory devices.

Dynamic random access memory (DRAM) is a common form of semiconductor memory. DRAM is commonly used for temporary data storage in electronic devices such as computing and telecommunication devices, as well as many others. DRAM has a number of desirable characteristics, including relatively low cost and high storage density.

A DRAM comprises a plurality of memory cells each comprising a capacitor for storing data and an access transistor for controlling access to the stored data. The plurality of memory cells are typically arranged in memory blocks that can be controlled independent of each other. The memory blocks are controlled by a plurality of control signals to perform functions such as read, write, and refresh operations. The control signals can comprise, for instance, row address strobe (RAS) signals, column address strobe (CAS) signals, and others.

Many of the control signals are characterized by parameters that vary according to different operating characteristics of different memory blocks. For instance, memory blocks containing leaky capacitors or other defects may need to be refreshed more frequently than memory blocks without defects, requiring certain control signals to use different timing parameters.

SUMMARY

Some embodiments of the inventive concept provide memory devices capable of setting individual control parameters for a plurality of memory blocks. Some embodiments provide memory systems comprising such memory devices.

According to one embodiment of the inventive concept, a memory device comprises a memory cell array comprising a plurality of memory blocks each comprising a plurality of memory cells, and a control setting circuit configured to group the memory blocks into at least first and second groups based on whether each of the memory blocks comprises at least one substandard memory cell, and further configured to set individually control parameters of the first and second groups. The presence or absence of at least one substandard memory cell in each memory block is determined based on test results obtained by performing a test on each memory block with respect to at least one of the control parameters. Each memory block in the first group comprises at least one substandard memory cell, and each memory block in the second group comprises no substandard memory cell.

In certain embodiments, the memory blocks are grouped into the first and second groups by selecting an address code for the memory blocks.

In certain embodiments, the control setting circuit selectively enables memory blocks of the first and second groups.

In certain embodiments, the at least one of the control parameters corresponds to at least one alternating current parameter of the memory cells, and the control setting circuit comprises a status register that stores the test result and provides status information regarding the test result, and an address mapper unit configured to convert logical addresses of the memory blocks into physical addresses of the first and second groups based on the status information.

In certain embodiments, the control setting circuit further comprises a pulse generator configured to generate an enable pulse signal to selectively enable the memory blocks of the first and second groups in response to a flag signal indicating a data storage capacity required by the memory device.

In certain embodiments, the address mapper unit converts the logical addresses of the memory blocks into the physical addresses of the first and second groups using disable signals corresponding to the logical addresses.

In certain embodiments, the disable signals are provided from a mode register set.

In certain embodiments, the address mapper unit converts the logical addresses of the memory blocks into the physical addresses of the first and second groups using phase inversion signals corresponding to the logical addresses.

In certain embodiments, the phase inversion signals are provided from a mode register set.

In certain embodiments, the address mapper unit converts row logical addresses and column logical addresses of the memory blocks into row physical addresses and column physical addresses of the first and second groups.

In certain embodiments, the address mapper unit provides the row logical addresses to a row address decoder to enable wordlines connected to the memory cells and provides the column logical addresses to a column address decoder to enable bitlines connected to the memory cells.

In certain embodiments, the address mapper unit comprises a first address mapper configured to convert the row logical addresses into the row physical addresses to be provided to a row address decoder to enable wordlines connected to the memory cells, and a second address mapper configured to convert the column logical addresses into the column physical addresses to be provided to a column address decoder to enable bitlines connected to the memory cells.

In certain embodiments, the memory device operates as a partial chip based on a distribution of the substandard memory cells within the memory blocks.

In certain embodiments, the memory device operates as a half chip based on a distribution of the substandard memory cells within the memory blocks.

In certain embodiments, the memory device operates as a quad chip based on a distribution of the substandard memory cells within the memory blocks.

According to another embodiment of the inventive concept, a memory system comprises a memory device comprising a plurality of memory blocks each comprising a plurality of memory cells and a control setting circuit, and a memory controller configured to control operations of the memory device. The control setting circuit is configured to divide the memory blocks into at least first and second groups based on whether the each of the memory blocks comprises at least one substandard memory cell, and further configured to set individually control parameters of the first and second groups. The substandard memory cells are identified based on test results obtained through a test performed on the memory cells with respect to at least one of the control parameters, and the first group comprises at least one substandard memory cell, and the second group comprises no substandard memory cell.

In certain embodiments, the memory device is a dynamic random access memory device.

According to another embodiment of the inventive concept, an application system comprises a bus, a microprocessor connected to the bus, and a memory device configured to store data to be processed by the microprocessor. The memory device comprises a memory cell array and a control setting circuit. The memory cell array comprises a plurality of memory blocks, each having a plurality of memory cells. The control setting circuit is configured to divide the memory blocks into at least first and second groups based on whether the each of the memory blocks comprises at least one substandard memory cell, and further configured to set individually control parameters of the first and second groups. The substandard memory cells are identified based on test results obtained through a test performed on the memory cells with respect to at least one of the control parameters, and the first group comprises at least one substandard memory cell, and the second group comprises no substandard memory cell, and wherein the control parameter corresponds to at least one alternating current parameter related to the operation of the memory cells.

In certain embodiments, the AC parameter comprises a row address signal to column address signal delay time, a row address signal precharge time, or a column address signal precharge time.

In certain embodiments, the memory device comprises a dynamic random access memory.

BRIEF DESCRIPTION OF THE DRAWINGS

The drawings illustrate various embodiments of the inventive concept. In the drawings, like reference numbers denote like features.

FIG. 1 is flow chart illustrating a method of controlling a memory device according to an embodiment of the inventive concept.

FIG. 2 is a block diagram illustrating a memory cell array according to an embodiment of the inventive concept.

DETAILED DESCRIPTION OF THE EMBODIMENTS

Figures 3, 4:
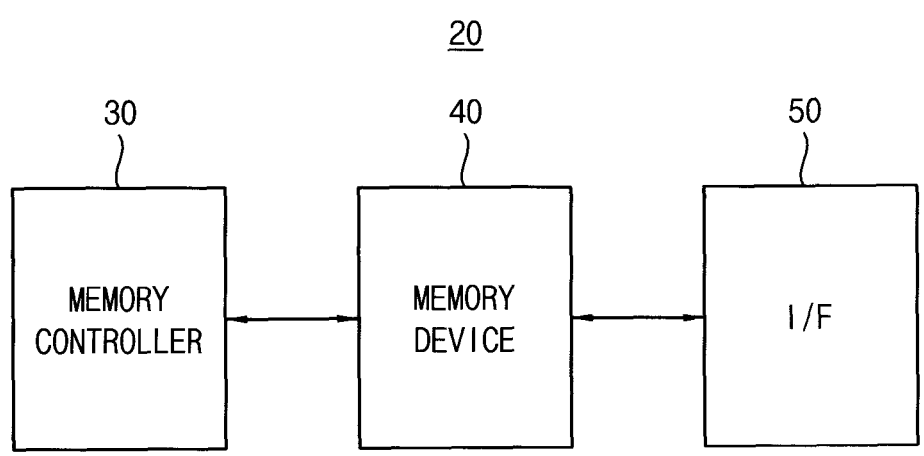
FIG. 3 is a table illustrating row address code values corresponding to memory blocks in the memory cell array of FIG. 2.
FIG. 4 is a block diagram illustrating a memory system according to an embodiment of the inventive concept.

Selected embodiments of the inventive concept are described below with reference to the accompanying drawings. These embodiments are presented as teaching examples and should not be construed to limit the scope of the inventive concept.

In the description that follows, the terms first, second, third etc. are used to describe various elements, but these elements should not be limited by these terms. Rather, these terms are used to distinguish one element from another. Thus, a first element discussed below could be termed a second element without departing from the teachings of the inventive concept. As used herein, the term "and/or" includes any and all combinations of one or more of the associated listed items.

Where an element is referred to as being "connected" or "coupled" to another element, it can be directly connected or coupled to the other element or intervening elements may be present. On the other hand, where an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing example embodiments only and is not intended to be limiting of the inventive concept. As used herein, the singular forms "a," "an" and "the" are intended to include the plural forms as well, unless the context clearly indicates otherwise. The terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is flow chart illustrating a method 5 of controlling a memory device according to an embodiment of the inventive concept. In the description that follows, example method steps are indicated by parentheses (SXXX).

Referring to FIG. 1, method 5 comprises performing a test with regard to one or more control parameters of memory cells in the memory device (S10). The control parameters can comprise, for instance, an AC parameters used in operations performed on a memory block by memory block basis. The AC parameters can comprise, for instance, RAS to CAS delay time ($t_{RCD}$), RAS precharge time ($t_{RCD}$), and CAS precharge time ($t_{CP}$). The AC parameters can be related to operating speed of the memory device.

Following the tests, the memory blocks are divided into at least first and second groups based on whether each of the memory blocks comprises one or more substandard memory cells (S20). The substandard memory cells can be identified based on the results of the tests performed in step S10. For instance, if a particular adjustment of one of the parameters causes a memory cell to lose stored data, the memory cell may be identified as a substandard memory cell.

Each memory block in the first group comprises at least one substandard memory cell, and each memory block of the second group does not comprise any substandard memory cell. The substandard memory cells exhibit degraded characteristics with respect to the one or more AC parameters. Accordingly, control parameters of the first and second groups are set independent of each other in light of the degraded characteristics of the one or more AC parameters (S30).

FIG. 2 is a block diagram illustrating a memory cell array 10 according to an embodiment of the inventive concept, and FIG. 3 is a table illustrating row address code values corresponding to memory blocks in memory cell array 10.

Referring to FIGS. 2 and 3, memory cell array 10 comprises sixteen memory blocks 111, 112, 121, 122, 131, 132, 141, 142, 151, 152, 161, 162, 171, 172, 181 and 182 (hereinafter, memory blocks 111 through 182). Each of memory blocks 111 through 182 corresponds to several rows of memory cells having row addresses RA[12:0]. Each memory block corresponds to a set of memory cells having row address bits RA[12:9]. For instance, as illustrated in FIG. 4, memory block 111 comprises memory cells having row address bits RA[12:9]="0000", memory block 112 comprises memory cells having row address bits RA[12:9]="0001", and so on.

Each of memory blocks 111 through 182 corresponds to a set of memory cells having the same row address bits RA[12:9]. Moreover, each of memory blocks 111 through 182 can correspond to a different memory bank. Memory blocks 111 through 182 can be divided into a first group comprising memory blocks 111, 112, 121, 122, 131, 132, 141 and 142, and a second group comprising memory blocks 151, 152, 161, 162, 171, 172, 181 and 182 based on row address code RA12. The memory blocks can be divided into four groups (111, 112, 121 and 122; 131, 132, 141 and 142; 151, 152, 161 and 162; and 171, 172, 181 and 182) based on row address code RA[12, 11]. The memory blocks can be divided into eight groups (111 and 112; 121 and 122; 131 and 132; 141 and 142; 151 and 152; 161 and 162; 171 and 172; 181 and 182) based on row address code RA[12:10]. The memory blocks can be distinguished individually based on row address code RA[12:9].

In FIG. 2, each of memory blocks 111, 121 132, 151, 161 and 181 comprises at least one substandard memory cell indicated by a black dot. The at least one substandard memory cell in memory block 111 is labeled "FAIL CELL".

Where memory cell array 10 is divided into two groups based on row address code RA[12:10], the first group comprises memory blocks 111, 121, 131, 141, 151, 161, 171 and 181, and the second group comprises memory blocks 112, 122, 132, 142152, 162, 172 and 182. Therefore, each of the two groups comprises at least one substandard memory cell. Thus, the control parameters of both groups should be set to accommodate the characteristics of the substandard memory cells. Consequently, both groups experience degraded performance due to the substandard cells.

On the other hand, where memory cell array 10 is divided into two groups based on row address code RA[12, 11, 09], the first group comprises memory blocks 111, 121, 132, 141, 151, 161, 171, 181, seven of which comprise at least one substandard memory cell, and the second group comprises memory blocks 112, 122, 131, 142, 152, 162, 172 and 182, none of which comprises a substandard memory cell. Therefore, control parameters of the memory blocks in the first group and control parameters of the memory blocks of the second group can be set individually. In particular, the control parameters of the first group can be set to accommodate the characteristics of the substandard cells, while the control parameters of the second group can be set without regard to the characteristics of substandard cells. By setting the control parameters of the second group without regard to the characteristics of substandard cells, the performance of the memory blocks in the second group can be improved relative to those in the first group. Moreover, where the amount of data storage required for a particular application is less than the total amount of data storage capacity provided by the memory device, the second group can be selectively enabled to improve the overall performance of the memory device.

The method of FIG. 1, as well as various implementations of the method, will be further understood from the description that follows.

FIG. 4 is a block diagram illustrating a memory system 20 according to an embodiment of the inventive concept. In the embodiment of FIG. 4, memory system 20 comprises a memory device 40, a memory controller 30, and an interface 50. Memory controller 30 controls input/output operations of memory device 40, memory device 40 comprises a plurality of memory cells for storing data, and interface 50 is used for communicating with an external device or users.

Figure 5:
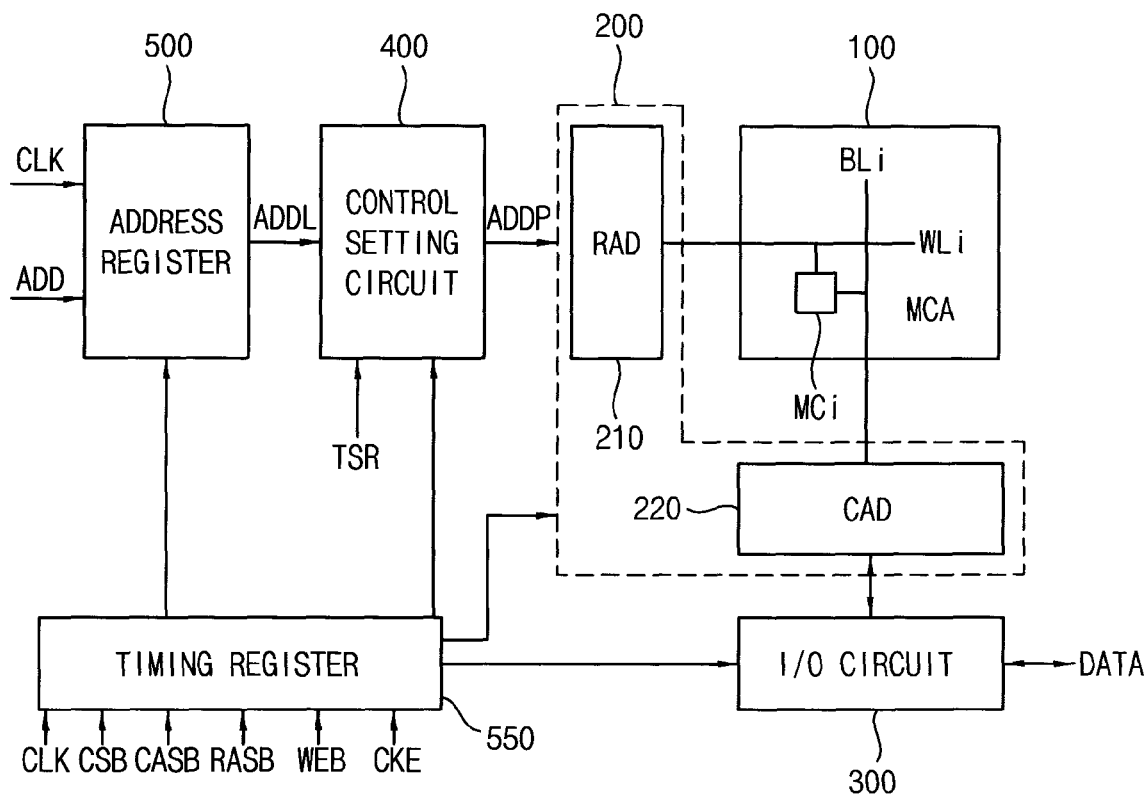
FIG. 5 is a block diagram illustrating a memory device according to an embodiment of the inventive concept.

FIG. 5 is a block diagram illustrating an example of memory device 40 according to an embodiment of the inventive concept.

In the embodiment of FIG. 5, memory device 40 comprises a memory cell array 100, an address decoder 200, an input/output (I/O) circuit 300, a control setting circuit 400, an address register 500, and a timing register 550.

Memory cell array 100 comprises a plurality of memory cells MCi arranged in rows and columns, where each row is connected to a corresponding word line WLi and each column is connected to a corresponding bit line BLi. Memory cells MCi are selected by a row address decoder 210 connected to wordline WLi and a column address decoder 220 connected to bitline BLi. Although one memory cell MCi, one wordline WLi, and one bitline BLi are illustrated in FIG. 5, memory cell MCi represents a plurality of memory cells, wordline WLi represents a plurality of wordlines and bitline BLi represents a plurality of bitlines.

Memory blocks of memory cell array 100 can be designated by a portion of a row address. For instance, assuming memory cell array 100 comprises $2^m$ rows of memory cells addressable by an m-bit row address, a sub-portion of the m-bit row address can designate rows belonging to the same memory block. As a more concrete example, assume memory cells of memory cell array 100 are addressable by a 13-bit row address designated RA[12:0], where RA12 denotes a first bit, RA11 denotes a second bit, etc. Row address bits RA[12:9] can be used to designate different memory blocks. In other words, memory cells having the same row address bits RA[12:9] form part of the same memory block, and therefore row address bits RA[12:9] may be used as a row address (RA) code for selecting a memory block for different operations such as a refresh operation. Because row address code RA[12:9] has four bits, it can be used to divide memory cell array 100 into sixteen memory blocks corresponding to the sixteen possible values of RA[12:9]: "0000," "0001," "0010", . . . , "1111."

Timing register 550 comprises timing elements for controlling the operation of other elements of memory device 40. In particular, timing register 550 comprises registers for storing and outputting a clock signal CLK, a chip select signal CSB, a row address strobe signal RASB, a column address strobe signal CASB, a write enable signal WEB, and a clock enable signal CKE. Timing register 550 outputs these various signals to address decoder 200, control circuit 400, address register 500, and I/O data circuit 300 to control the timing of various operations, such as the transfer of information to other elements.

Address register 500 comprises storage elements and data for receiving an external address ADD and converting external address ADD into a logical address ADDL to be provided to control setting circuit 400.

Control setting circuit 400 stores test results TSR regarding at least one control parameter of memory cells MCi. Control setting circuit 400 divides the memory blocks into at least first and second groups based on the locations of substandard memory cells, and sets individual control parameters for the different groups. The substandard memory cells can be identified based on test results obtained from the memory cells with respect to one or more AC parameters. In one example, each memory block in the first group comprises at least one substandard memory cell, and each memory block of the second group comprises no substandard memory cell. As explained with reference to FIG. 1, the AC parameter can comprise, for instance, RAS to CAS delay time ($t_{RCD}$), RAS precharge time ($t_{RCD}$), or CAS precharge time ($t_{CP}$). The AC parameters can be related to operating speed of memory device 40.

Control setting circuit 400 converts logical address ALLD from address register 500 into a physical address ADDP, divides the memory blocks into at least first and second groups based on the physical address ADDP, and selectively enables the memory blocks of the first and second groups. By selectively enabling certain memory blocks, memory device 40 can operate in a half chip mode or a quad chip mode. In other words, memory device 40 can operate as a partial chip.

I/O circuit 300 comprises a data buffer for receiving and storing input data DATA to be written to memory cell array 100 in a write operation, and output data DATA to be read from memory cell array 100 in a read operation.

Figure 6:
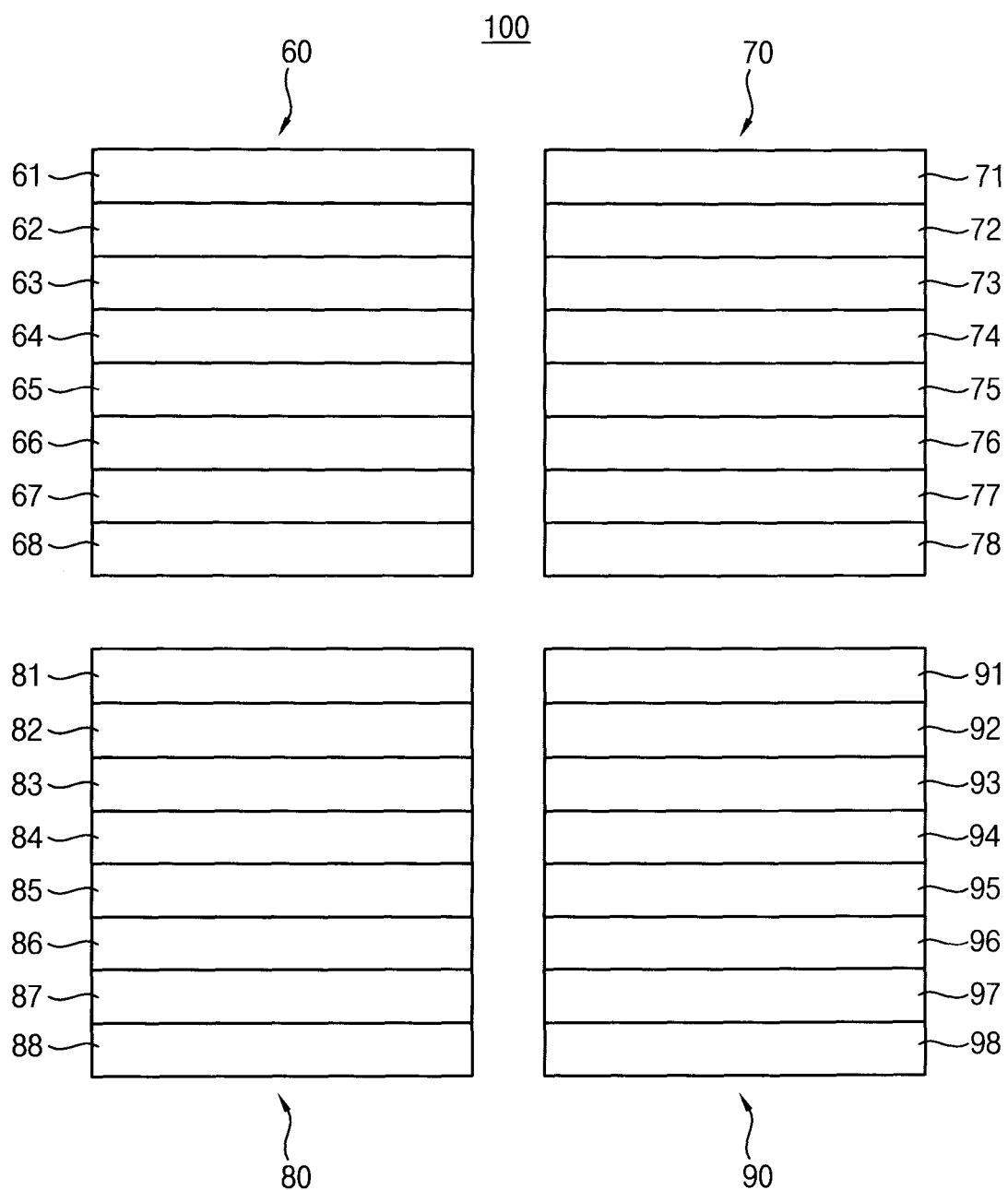
FIG. 6 is a block diagram illustrating an example of the memory cell array in FIG. 5 according to an embodiment of the inventive concept.

FIG. 6 is a block diagram illustrating an example of the memory cell array in FIG. 5 according to an embodiment of the inventive concept.

In the embodiment of FIG. 6, memory cell array 100 comprises a plurality of banks 60, 70, 80 and 90. Bank 60 is divided into a plurality of memory blocks 61~68. Bank 70 is divided into a plurality of memory blocks 71~78. Bank 80 is divided into a plurality of memory blocks 81~88. Bank 90 is divided into a plurality of memory blocks 91~98. Although not illustrated, banks 60, 70, 80 and 90 are typically connected with corresponding row and column decoders. Each of the row decoders and the column decoders can be configured to receive the same row address and same column address.

Figure 7:
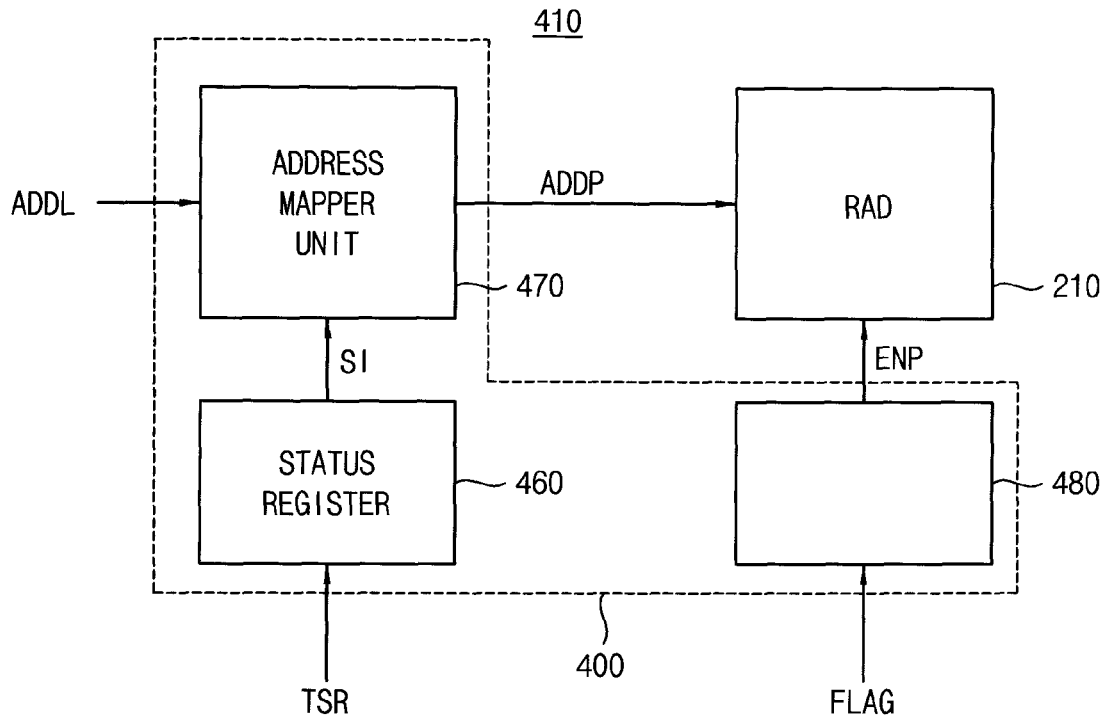
FIG. 7 is a block diagram illustrating an example of a control setting circuit in the memory device of FIG. 5 according to an embodiment of the inventive concept.

FIG. 7 is a block diagram illustrating an example of a control setting circuit 400 of FIG. 5 according to an embodiment of the inventive concept. In FIG. 7, control setting circuit 400 is illustrated together with row address decoder 210.

In the embodiment of FIG. 7, control setting circuit 400 comprises a status register 460 and an address mapper unit 470, and a pulse generator 480. Status register 460 stores a test result TSR and provides status information SI to address mapper 470. Address mapper 470 converts logical addresses ADDL of the memory blocks into physical addresses ADDP, in response to status information SI. Pulse generator 480 generates an enable pulse signal ENP to selectively enable memory blocks of different groups in response to a flag signal FLAG indicating a data storage capacity to be required.

Figure 8:
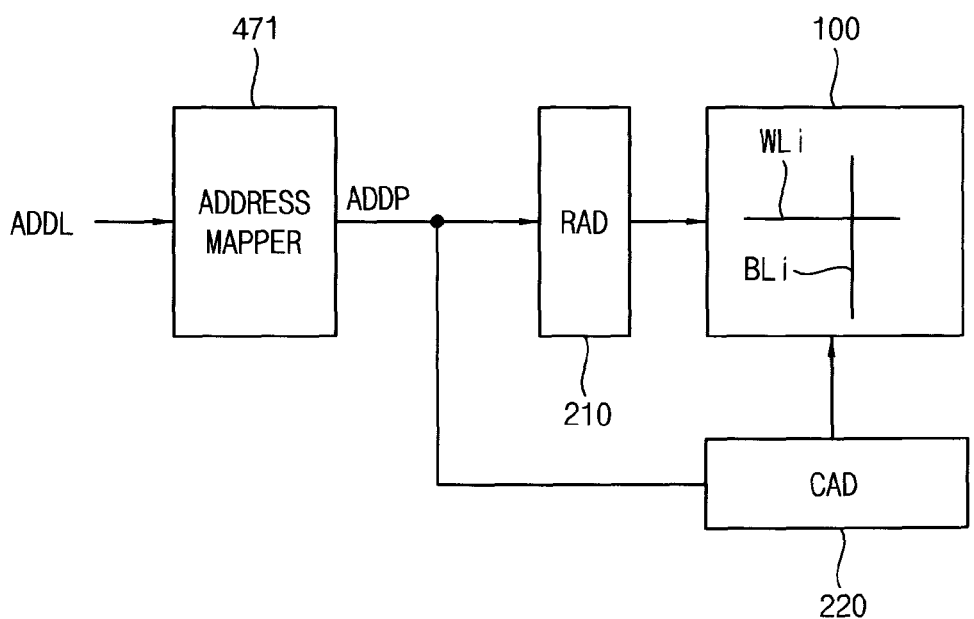
FIG. 8 is a block diagram illustrating an example of an address mapper unit in the control setting circuit of FIG. 7 according to an embodiment of the inventive concept.

FIG. 8 is a block diagram illustrating an example of address mapper unit 470 of FIG. 7 according to an embodiment of the inventive concept. In FIG. 8, memory cell array 100, row decoder 210 and column decoder 220 are illustrated altogether with an address mapper 471.

In the embodiment of FIG. 8, address mapper unit 470 comprises one address mapper 471 that converts logical addresses ADDL into physical addresses ADDP. That is, address mapper 471 converts logical addresses ADDL into physical addresses ADDP to be provided to row decoder 210 and column decoder 220. Row decoder 210 and column decoder 220 selectively enable respective wordlines WLi and bitlines BLi of memory cell array 100 to perform operations requested by a memory controller (not illustrated) according to the physical addresses ADDP.

Figure 9:
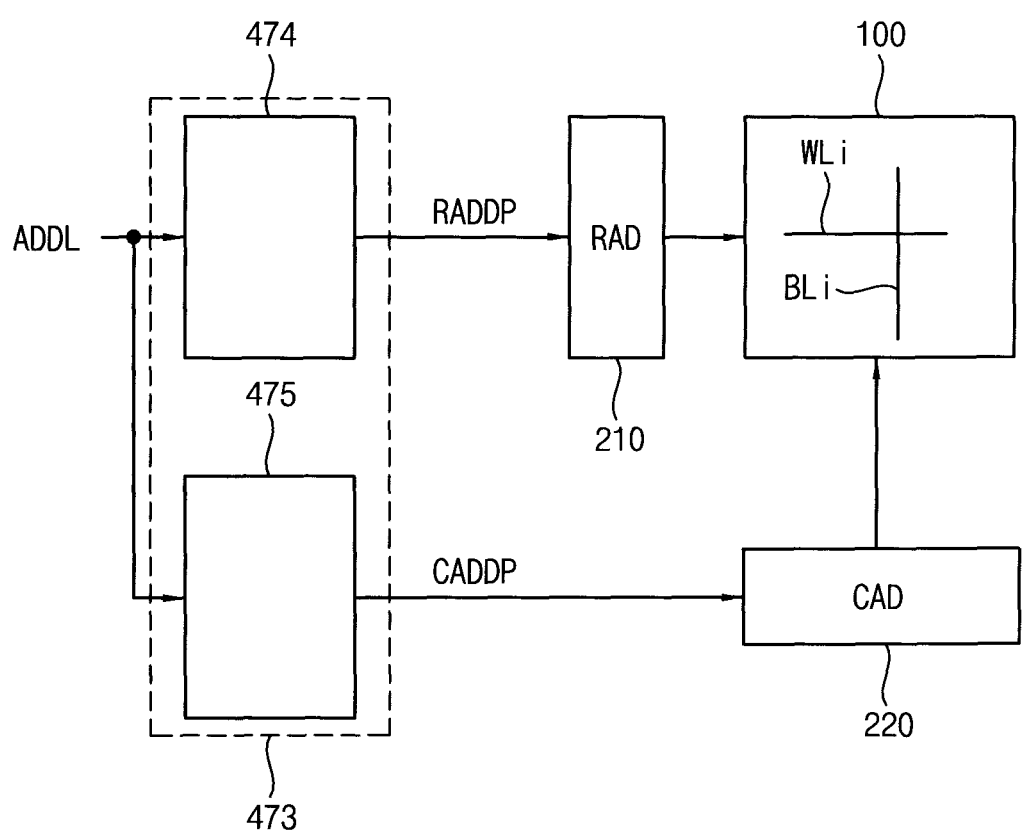
FIG. 9 is a block diagram illustrating another example of the address mapper unit in FIG. 7 according to an embodiment of the inventive concept.

FIG. 9 is a block diagram illustrating another example of the address mapper unit in FIG. 7 according to an embodiment of the inventive concept. In FIG. 9, memory cell array 100, row decoder 210 and column decoder 220 are illustrated altogether with an address mapper unit 473.

In the embodiment of FIG. 9, address mapper unit 473 comprises first and second address mappers 474 and 475. First address mapper 474 converts row logical addresses of logical addresses ADDL into row physical addresses RADDP to be provided to row decoder 210. Second address mapper 475 converts column logical addresses of logical addresses ADDL into column physical addresses CADDP to be provided to column decoder 220. Row decoder 210 and column decoder 220 selectively enable respective wordlines WLi and bitlines BLi of memory cell array 100 to perform operations requested by a memory controller (not illustrated) according to row and column physical addresses RADDP and CADDP.

Figure 10A:
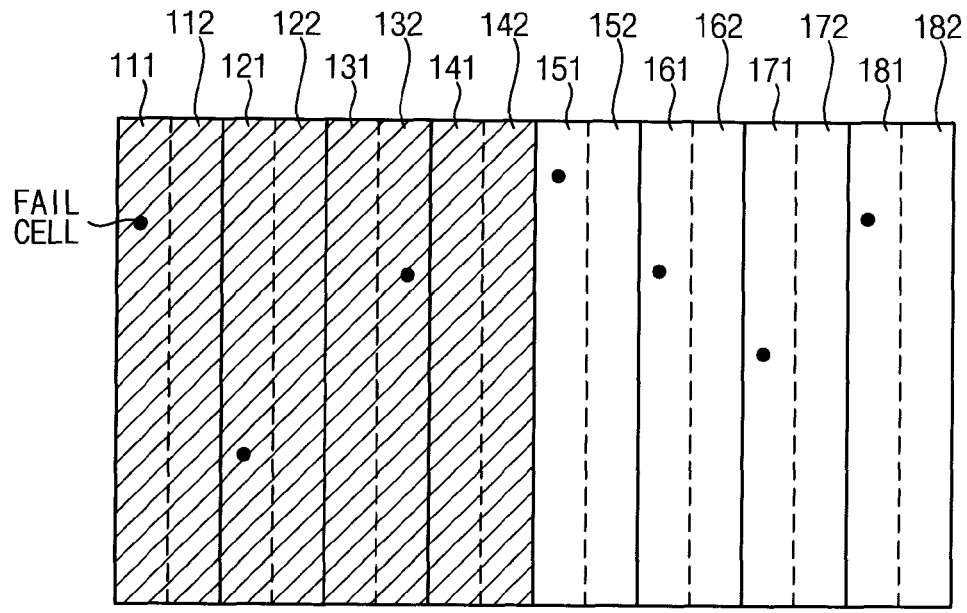
FIGS. 10A through 10C illustrate examples of the memory blocks of FIG. 2 divided into different groups based on different row address codes.
Figure 10B:
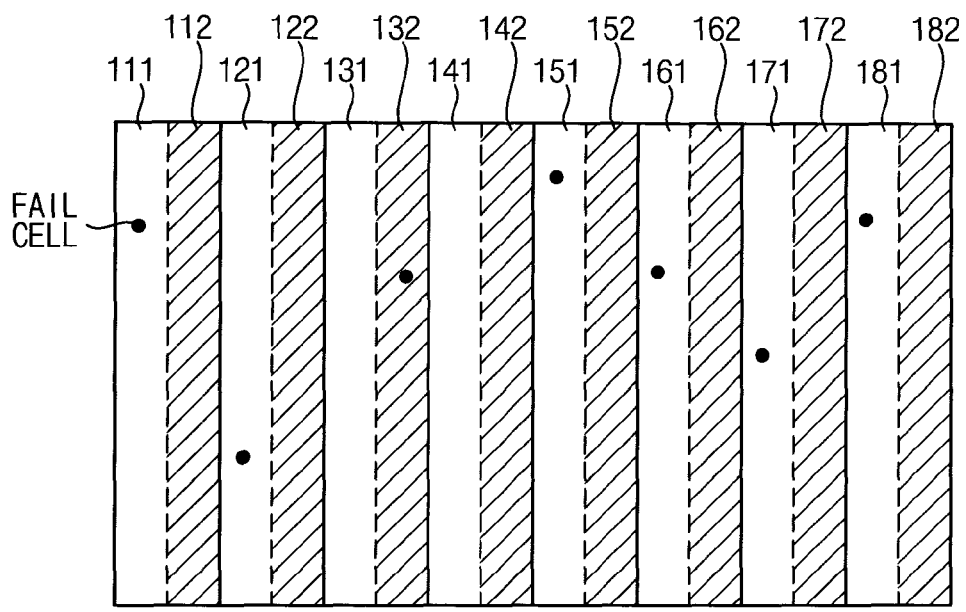
Figure 10C:
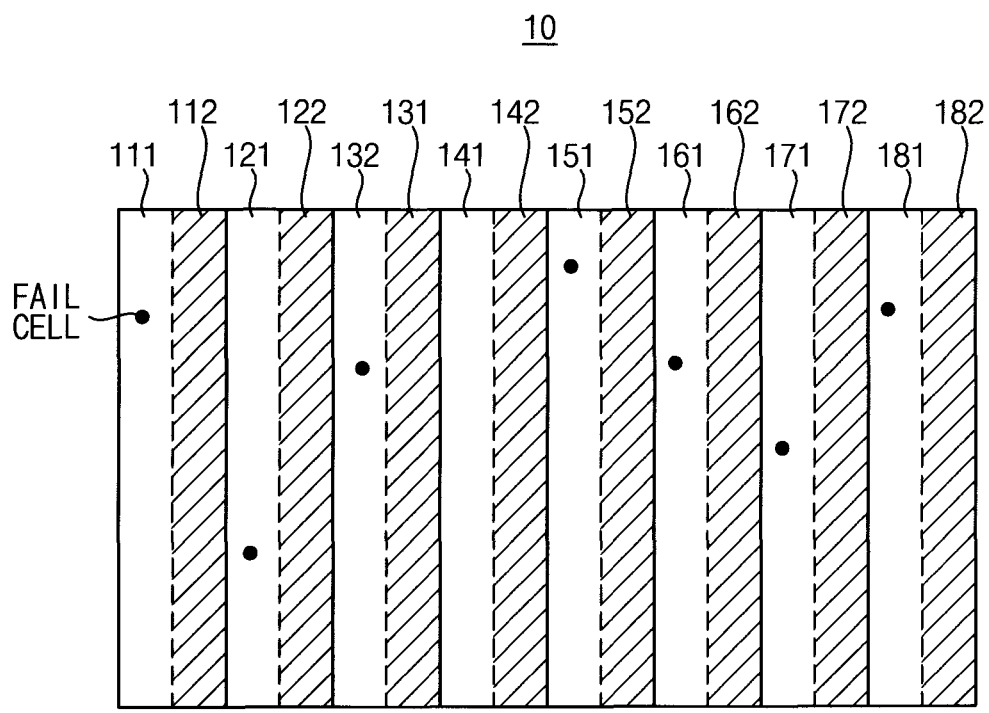

FIGS. 10A through 10C illustrate various examples where memory blocks 111 through 182 of FIG. 2 are divided into first and second groups according to different row address codes.

FIG. 10A illustrates an example where memory blocks 111 through 182 are divided into first and second groups according to address code RA[12]. Referring to FIG. 10A, the first group comprises memory blocks 111, 112, 121, 122, 131, 132, 141 and 142, and the second group comprises memory blocks 151, 152, 161, 162, 171, 172, 181 and 182. In this example, memory blocks 111, 121 132, 151, 161 and 181 comprises a substandard memory cell. Therefore, each of the first and second groups comprises at least one substandard memory cell. Accordingly, the control parameters of the memory blocks of the first and second groups are set to accommodate characteristics of the substandard memory cells.

FIG. 10B illustrates an example where the memory blocks are divided into first and second groups according to address code RA[12:10]. Referring to FIG. 10B, the first group comprises memory blocks 111, 121, 131, 141, 151, 161, 171 and 181, and the second group comprises memory blocks 112, 122, 132, 142, 152, 162, 172 and 182. In this example, each of memory blocks 111, 121 132, 151, 161 and 181 comprises at least one substandard memory cell. Therefore, each of the first and second groups comprises at least one substandard memory cell. Accordingly, the control parameters of the memory blocks of the first and second groups are all set based on characteristics of the substandard memory cells.

FIG. 10C illustrates an example where the memory blocks are divided into first and second groups according to address code RA[12, 11, 9]. Referring to FIG. 10C, the first group comprises memory blocks 111, 121, 132, 141, 151, 161, 171 and 181, and the second group comprises memory blocks 112, 122, 131, 142, 152, 162, 172 and 182. To achieve these groups, logical addresses of memory blocks 131 and 132 have been converted into physical addresses of memory blocks 132 and 131, respectively, as indicated by the reordering of the labels 132 and 131 in FIG. 10C.

Each of memory blocks 111, 121 132, 151, 161 and 181 comprises at least one substandard memory cell, and therefore the first group comprises substandard memory cells, and the second group comprises no substandard memory cells. Accordingly, the control parameters of the memory blocks of the first are set based on characteristics of the substandard memory cells, and the control parameters of the memory blocks of the second groups are set based on the characteristics of normal memory cells.

Where the amount of data storage required by memory device 40 is less than the storage capacity of memory cell array 10, the memory blocks of the second group can be selectively enabled to enhance the overall operating speed of memory cell array 10.

Figure 11A:
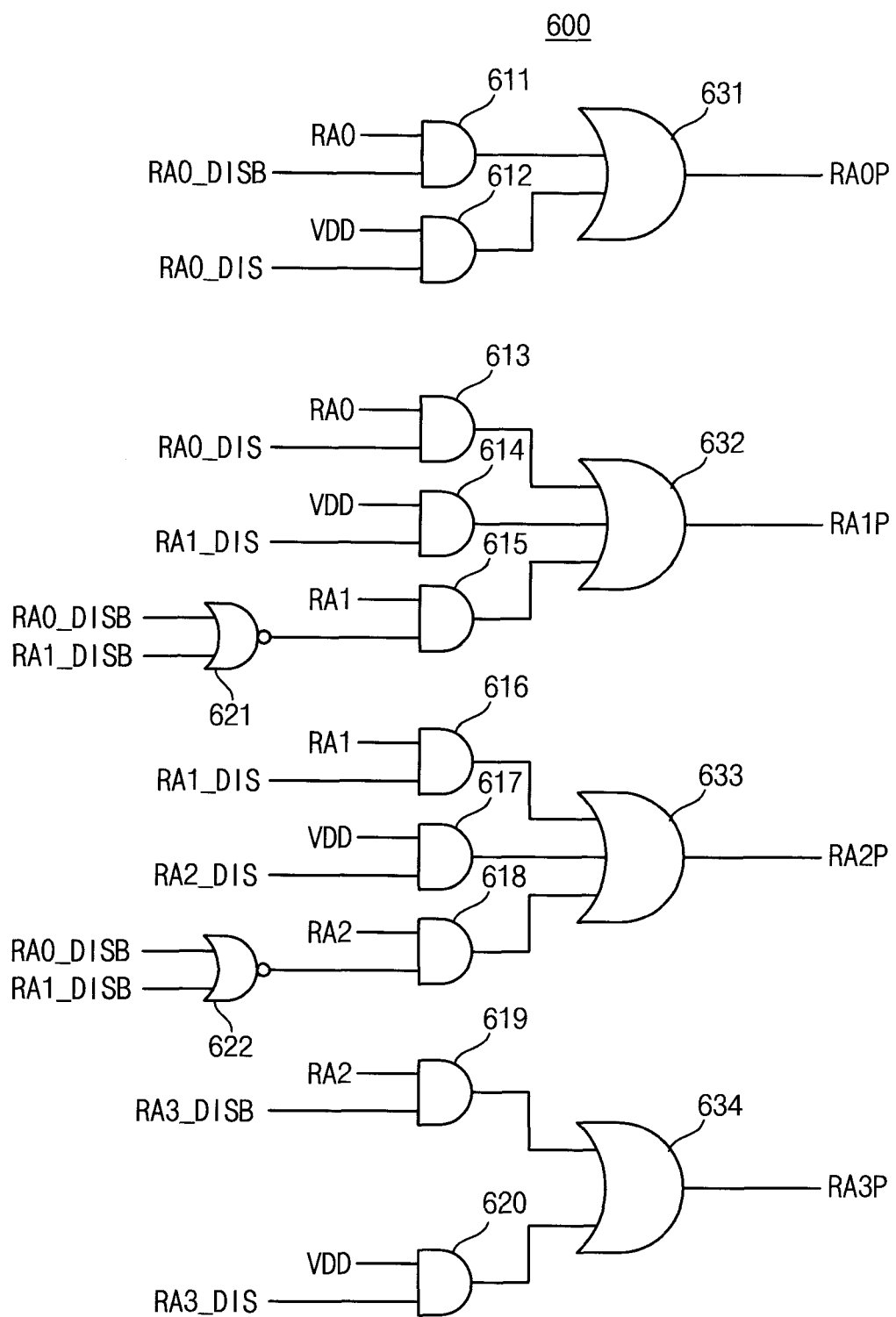
FIG. 11A illustrates an example of address mapping logic that can be incorporated in the address mapper unit of FIG. 7 according to embodiment of the inventive concept.
Figures 11B, 12A:
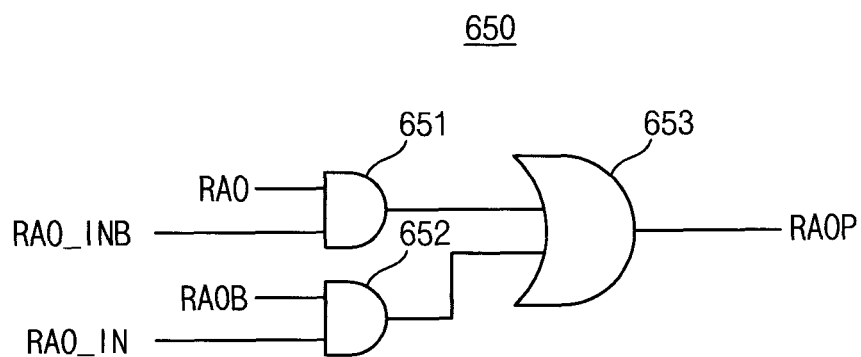
FIG. 11B is a table illustrating results of address mapping using the address mapping logic of FIG. 11A.
FIGS. 12A and 13A illustrate examples of address mapping logic that can be incorporated in the address mapper unit of FIG. 7 according to other embodiments of the inventive concept.

FIG. 11A illustrates an address mapping logic 600 that can be included in the address mapper unit 470 of FIG. 7 according to an embodiment of the inventive concept. FIG. 11B is a table illustrating the results of address mapping performed by address mapping logic 600 of FIG. 11A.

FIGS. 11A and 11B illustrate an example where logical addresses are converted into physical addresses using disable signals corresponding to the logical addresses.

Referring to FIG. 11A, an address mapping logic 600 comprises a plurality of AND gates 611~620, NOR gates 621 and 622, and a plurality of OR gates 631~634. In FIG. 11A, logical addresses are labeled RA0~RA3, disable signals corresponding to the logical addresses are labeled RA0_DIS (B)~RA3_DIS(B), and physical addresses are labeled RA0P~RA3P. The power supply voltage is labeled VDD. The disable signals RA0_DIS(B)~RA3_DIS(B) corresponding to the logical addresses may be provided from a mode register set.

Referring to FIGS. 11A and 11B, logical addresses RA0~RA2 are converted into physical addresses RA0P~RA3P according to combination of the disable signals RA0_DIS(B)~RA3_DIS(B) and power supply voltage VDD. Where the logic levels of the disable signals RA0_DIS~RA3_DIS are (1, 0, 0, 0), logical addresses RA0, RA1 and RA2 are converted into physical addresses RA1P, RA2P, and RA3P. Where the logic levels of disable signals RA0_DIS~RA3_DIS are (0, 1, 0, 0), logical addresses RA0, RA1 and RA2 are converted into a physical addresses RA0P, RA2P, and RA3P. Where the logic levels of disable signals RA0_DIS~RA3_DIS are (0, 0, 1, 0), logical addresses RA0, RA1 and RA2 are converted into physical addresses RA0P, RA1P, and RA3P. Where the logic levels of disable signals RA0_DIS~RA3_DIS are (0, 0, 0, 1), logical addresses RA0, RA1 and RA2 are converted into the physical addresses RA0P, RA1P, and RA2P.

In FIGS. 11A and 11B, logical addresses RA0~RA2 and physical addresses RA0P~RA3P are illustrated as examples, and each of the logical addresses RA0~RA2 can correspond to a row address code RA[12:10] and each of the physical addresses RA0P~RA3P can correspond to a physical address corresponding to row address code RA[12:9].

Figures 12B, 13A, 13B:
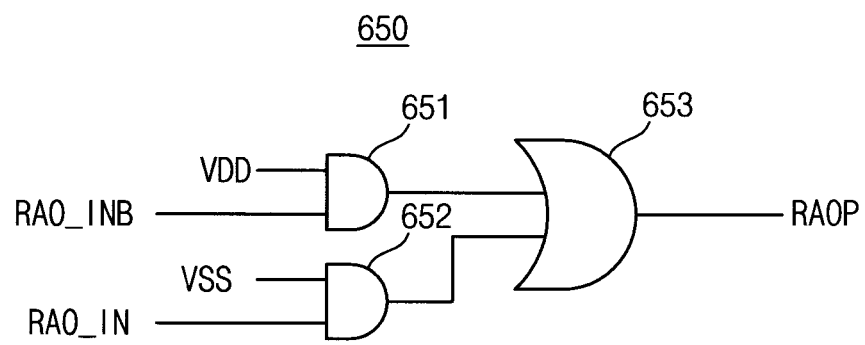
FIGS. 12B and 13B are tables illustrating results of address mapping using the address mapping logic of FIGS. 12A and 13A.

FIGS. 12A and 13A illustrate examples of address mapping logic 650 that can be included in address mapper unit 470 of FIG. 7 according to example embodiments. FIGS. 12B and 13B are tables illustrating results of performing address mapping using address mapping logic 650 of FIGS. 12A and 13A.

In the examples of FIGS. 12A through 13B, logical addresses are converted into the physical addresses using phase inversion signals corresponding to the logical addresses. The phase inversion signals can be provided from a mode register set.

In the example of FIGS. 12A and 12B, physical address RA0 is enabled.

Referring to FIG. 12A, address mapping logic 650 comprises AND gates 651 and 652 and an OR gate 653. AND gate 651 receives logical address RA0 and an inverted phase inversion signal RA0_INB. AND gate 652 receives inverted logical address RA0B and a phase inversion signal RA0_IN. As a result, physical address RA0P is logical address RA0 where phase inversion signal RA0_IN has a logic low level, and physical address RA0P is inverted logical address RA0B where phase inversion signal RA0_IN has a logic high level.

FIGS. 13A and 13B illustrate an example where physical address RA0 is disabled. The embodiment of FIG. 13A can be used, for instance, where the first group comprises substandard memory cells, and the first group is not disabled when the memory device operate in a half chip mode.

Referring to FIG. 13A, address mapping logic 650 comprises AND gates 651 and 652, and OR gate 653. AND gate 651 receives power supply voltage VDD and inverted phase inversion signal RA0_INB. AND gate 652 receives ground voltage VSS and phase inversion signal RA0_IN. As a result, physical address RA0P assumes the logic high level where phase inversion signal RA0_IN has the logic low level, and physical address RA0P assumes the logic low level where phase inversion signal RA0_IN has the logic high level.

In FIGS. 12A through 13B, logical address RA0 and physical address RA0P are illustrated as examples, and logical address RA0 corresponds to one of the bits in row address code RA[12:9], and physical addresses RA0P corresponds to a bit of a physical address corresponding to row address code RA[12:9].

Figure 14:
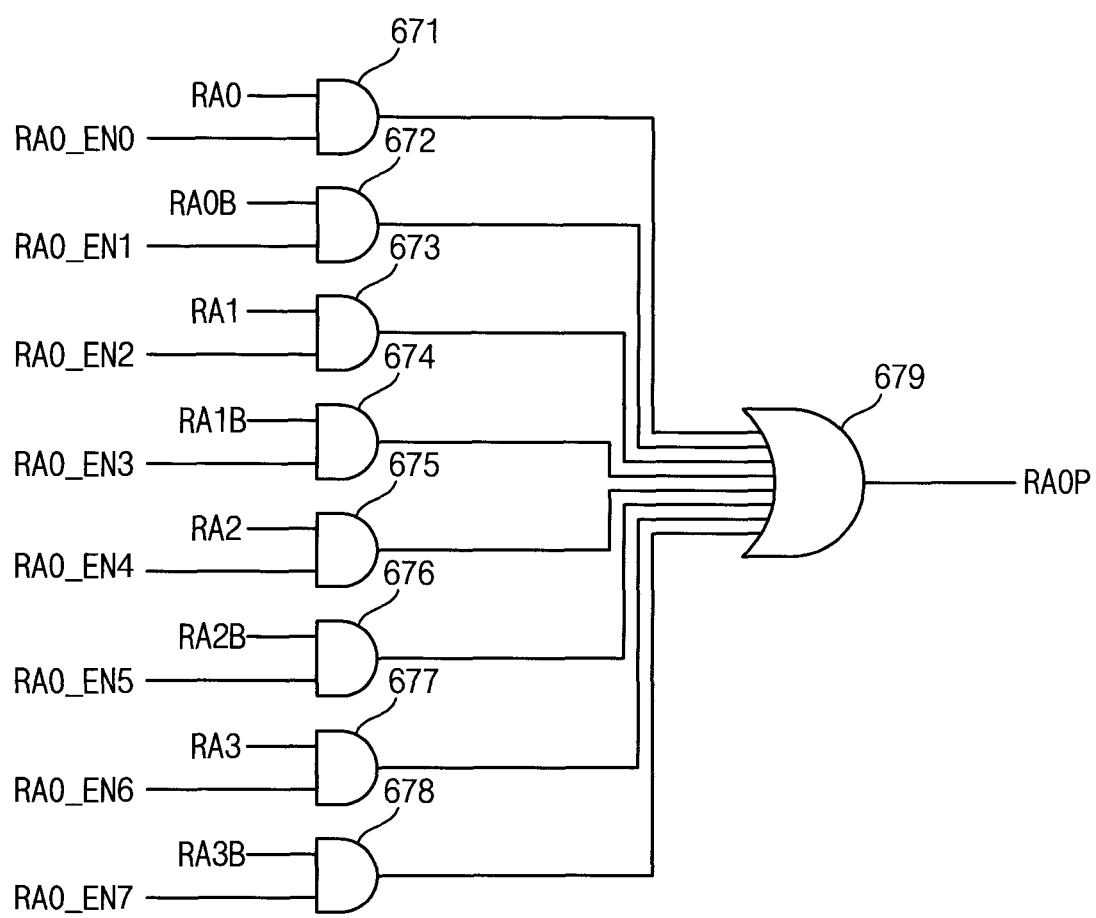
FIG. 14 illustrates yet another example of address mapping logic that can be incorporated in the address mapper unit of FIG. 7 according to still other embodiments of the inventive concept.

FIG. 14 illustrates an address mapping logic 670 that can be included in address mapper unit 470 of FIG. 7 according to another embodiment of the inventive concept.

Referring to FIG. 14, address mapping logic 670 comprises AND gates 671~678 and an OR gate 679. Logical addresses RA0~RA3 are converted into physical address RA0P according to combination of inverted logical address signals RA0B~RA3B and enable signals RA0_EN0~RA0_EN7. Address mapping logic 670 of FIG. 14 can be used, for instance, where the memory device operates as a partial chip in addition to the half chip. In FIG. 14, logical addresses RA0~RA0 and physical address RA0P are illustrated as examples, and each of logical addresses RA0~RA3 can correspond to a bit of row address code RA[12:9], while physical addresses RA0P~RA3P can correspond to bits of physical addresses corresponding to row address code RA[12:9].

As illustrated in FIGS. 7 through 14, control setting circuit 400 converts a logical address of a memory block comprising substandard memory cells into a physical address of a memory block comprising no substandard memory cell. Memory cell array 10 is then divided into a first group comprising substandard memory cells and a second group comprising no substandard memory cells. Memory blocks of memory cell array 10 can then be selectively enabled according to the data storage capacity to be required, in response to a flag signal FLAG. For example, flag signal FLAG can indicate ¼, a quarter of the memory blocks of memory cell array 10 in response to the enable pulse signal ENP. The quarter of the memory blocks can be included in the second group.

Figure 15:
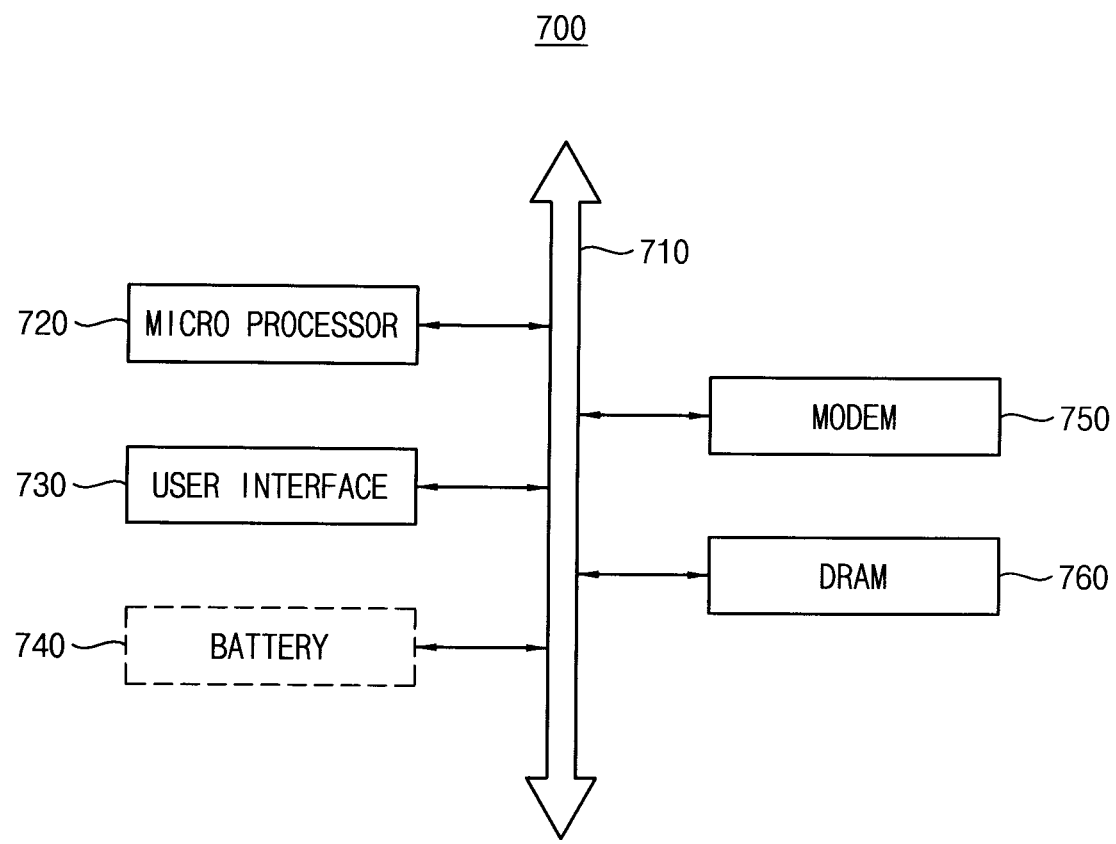
FIG. 15 illustrates an application system incorporating a memory device according to an embodiment of the inventive concept.

FIG. 15 illustrates an application system 700 comprising a memory device 760 according to an embodiment of the inventive concept.

Referring to FIG. 15, application system 700 comprises a microprocessor (or CPU) 720, a user interface 730, a power source 740, a modem 750 and a memory device 760, all connected to each other by a bus and/or network architecture 710.

Application system 700 can take any of several different forms, such as a personal computer, workstation, networking device, gaming-console, handheld device, or embedded system, to name but a few. Additionally, system 10 and its components can be distributed or divided into many sub-components, such as multiple CPU cores, distributed memories, a distributed bus or network architecture, remote user interfaces, and so on.

Application system 700 can be implemented as a portable or non-portable device. Accordingly, power source 740 can comprise a portable source of power, such as a battery, or a stationary source of power, such as an alternating current (AC) outlet. Moreover, power source 740 can comprise more than one source of power for powering different elements of application system 700.

Memory device 760 typically comprises at least one volatile memory such as a DRAM. Moreover, memory device 760 can comprise more than one memory chip, which can comprise multiple types and sizes of memories, as well as memories using different protocols. For instance, memory device 760 can comprise a volatile memory such as a DRAM in combination with other forms of memory such as a nonvolatile memory.

Memory device 760 and any constituent chips can be organized in any of several different architectures. For instance, memory device 760 may be organized in any number of chips, banks, memory blocks, sectors, and so on. Such elements may be arranged in hierarchies (e.g., L2, L3 caches, etc.), in parallel, or in a combination of hierarchical, parallel, or other configuration.

Memory device 760 can be packaged or integrated with other devices to form any of several different products or components. For instance, memory device 760 may be packaged in a memory card or other standalone memory product, or it may form part of a system-on-a-chip having numerous additional elements.

Memory device 760 stores data that has been processed or is to be processed by microprocessor 720.

As indicated by the foregoing, memory blocks in a memory device can be divided into at least two groups based on whether the memory blocks include substandard memory cells. Control parameters of first and second groups can be set individually, and memory blocks of groups without substandard memory cells can be selectively enabled to enhance the operating speed of the memory device.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A memory device comprising:
 a memory cell array comprising a plurality of memory blocks each comprising a plurality of memory cells;
 a control setting circuit configured to group the memory blocks into at least first and second groups based on whether each of the memory blocks comprises at least one substandard memory cell, and further configured to respectively set first control parameters for the first group and second control parameters, different from the first control parameters, for the second group,
 wherein the presence or absence of at least one substandard memory cell in each memory block is determined based on test results obtained by performing a test on each memory block with respect to at least one control parameter,
 each memory block in the first group comprises at least one substandard memory cell,
 each memory block in the second group comprises no substandard memory cell, and
 memory cells of the first group are respectively accessed according to the first control parameters and memory cells of the second group are respectively accessed according to the second control parameters during operation of the memory device.

2. The memory device of claim 1, wherein the memory blocks are grouped into the first and second groups by selecting an address code for the memory blocks.

3. The memory device of claim 1, wherein the control setting circuit selectively enables memory blocks of the first and second groups.

4. The memory device of claim 1, wherein each of the first control parameters and the second control parameters includes at least one alternating current (AC) parameter of the memory cells, and
 the control setting circuit comprises:
 a status register that stores the test result and provides status information regarding the test result; and
 an address mapper unit configured to convert logical addresses of the memory blocks into physical addresses of the first and second groups based on the status information.

5. The memory device of claim 4, wherein the control setting circuit further comprises:
 a pulse generator configured to generate an enable pulse signal to selectively enable the memory blocks of the first and second groups in response to a flag signal indicating a data storage capacity required by the memory device.

6. The memory device of claim 4, wherein the address mapper unit converts the logical addresses of the memory blocks into the physical addresses of the first and second groups using disable signals corresponding to the logical addresses.

7. The memory device of claim 6, wherein the disable signals are provided from a mode register set.

8. The memory device of claim 4, wherein the address mapper unit converts the logical addresses of the memory blocks into the physical addresses of the first and second groups using phase inversion signals corresponding to the logical addresses.

9. The memory device of claim 8, wherein the phase inversion signals are provided from a mode register set.

10. The memory device of claim 4, wherein the address mapper unit converts row logical addresses and column logical addresses of the memory blocks into row physical addresses and column physical addresses of the first and second groups.

11. The memory device of claim 10, wherein the address mapper unit provides the row logical addresses to a row address decoder to enable wordlines connected to the memory cells and provides the column logical addresses to a column address decoder to enable bitlines connected to the memory cells.

12. The memory device of claim 10, wherein the address mapper unit comprises:
   a first address mapper configured to convert the row logical addresses into the row physical addresses to be provided to a row address decoder to enable wordlines connected to the memory cells; and
   a second address mapper configured to convert the column logical addresses into the column physical addresses to be provided to a column address decoder to enable bitlines connected to the memory cells.

13. The memory device of claim 1, wherein the memory device operates as a partial chip based on a distribution of the substandard memory cells within the memory blocks.

14. The memory device of claim 13, wherein the memory device operates as a half chip based on a distribution of the substandard memory cells within the memory blocks.

15. The memory device of claim 13, wherein the memory device operates as a quad chip based on a distribution of the substandard memory cells within the memory blocks.

16. A memory system, comprising:
   a memory device comprising:
   a plurality of memory blocks each comprising a plurality of memory cells; and
   a control setting circuit configured to group the memory blocks into at least first and second groups based on whether each of the memory blocks comprises at least one substandard memory cell, and further configured to respectively set first control parameters for the first group and second control parameters, different from the first control parameters, for the second group, wherein the presence or absence of at least one substandard memory cell in each memory block is determined based on test results obtained by performing a test on each memory block with respect to at least one control parameter, each memory block in the first group comprises at least one substandard memory cell, and each memory block in the second group comprises no substandard memory cell; and
   a memory controller configured to control operations of the memory device, wherein memory cells of the first group are respectively accessed by the memory controller according to the first control parameters, and memory cells of the second group are respectively accessed by the memory controller according to the second control parameters.

17. The memory system of claim 16, wherein the memory device is a dynamic random access memory device.

18. An application system comprising:
   a bus;
   a microprocessor connected to the bus; and
   a memory device configured to store data to be processed by the microprocessor, the memory device comprising:
   a memory cell array comprising a plurality of memory blocks, each having a plurality of memory cells; and
   a control setting circuit configured to divide the memory blocks into at least first and second groups based on whether the each of the memory blocks comprises at least one substandard memory cell, and further configured to respectively set first control parameters including at least one alternating current (AC) parameter for the first group and second control parameters, different from the first control parameters and including at least one AC parameter for the second group, wherein the substandard memory cells are identified based on test results obtained through a test performed on the memory cells with respect to at least one control parameter, the first group comprises at least one substandard memory cell, the second group comprises no substandard memory cell, and memory cells of the first group are respectively accessed according to the first control parameters and memory cells of the second group are respectively accessed according to the second control parameters during operation of the memory device.

19. The application system of claim 18, wherein the at least one AC parameter comprises at least one of; a row address signal (RAS) to column address signal (CAS) delay time, a RAS precharge time, and a CAS precharge time.

20. The application system of claim 18, wherein the memory device comprises a dynamic random access memory.

* * * * *